(12) United States Patent
Li et al.

(10) Patent No.: US 12,543,436 B2
(45) Date of Patent: Feb. 3, 2026

(54) DISPLAY PANEL AND PREPARATION METHOD THEREFOR, AND DISPLAY DEVICE

(71) Applicant: BOE Technology Group Co., Ltd., Beijing (CN)

(72) Inventors: Yansong Li, Beijing (CN); Yue Liu, Beijing (CN); Na Bi, Beijing (CN); Shanshan Bai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 483 days.

(21) Appl. No.: 17/922,557

(22) PCT Filed: Oct. 19, 2021

(86) PCT No.: PCT/CN2021/124659
§ 371 (c)(1),
(2) Date: Oct. 31, 2022

(87) PCT Pub. No.: WO2022/111134
PCT Pub. Date: Jun. 2, 2022

(65) Prior Publication Data
US 2023/0354641 A1    Nov. 2, 2023

(30) Foreign Application Priority Data

Nov. 30, 2020    (CN) .......................... 202011374922.0

(51) Int. Cl.
*H10K 59/121*    (2023.01)
*H10K 50/822*    (2023.01)
(Continued)

(52) U.S. Cl.
CPC ......... *H10K 59/121* (2023.02); *H10K 50/822* (2023.02); *H10K 59/122* (2023.02);
(Continued)

(58) Field of Classification Search
CPC .. H10K 59/121; H10K 59/122; H10K 59/353; H10K 59/875; H10K 59/80515;
(Continued)

(56) References Cited

U.S. PATENT DOCUMENTS 10,050,099 B2    8/2018   Kim et al.
2017/0077209 A1  3/2017   Kim et al.
(Continued)

FOREIGN PATENT DOCUMENTS

CN    110010665 A    7/2019
CN    110391254 A    10/2019
(Continued)

OTHER PUBLICATIONS

Hu Translation (Year: 2020).*
(Continued)

*Primary Examiner* — Steven B Gauthier
*Assistant Examiner* — Rhys Poniente Sheker
(74) *Attorney, Agent, or Firm* — XSENSUS LLP

(57) ABSTRACT

A display panel is provided, has a first region and a second region and includes a base substrate; a light-emitting layer arranged on a side of the base substrate, the light-emitting layer includes a plurality of light-emitting patterns, and orthographic projections of the plurality of light-emitting patterns on the base substrate do not overlap with each other; a plurality of transparent suppression patterns arranged on the side of the base substrate and located between at least a part of adjacent light-emitting patterns, the plurality of transparent suppression patterns are located in the first region and spaced apart; a first electrode arranged on a side of the light-emitting layer away from the base substrate, a plurality of through holes are defined on the first electrode, orthographic projections of the through holes on the base (Continued)

substrate overlap with that of the transparent suppression patterns on the base substrate.

13 Claims, 5 Drawing Sheets

(51) Int. Cl.
*H10K 59/122* (2023.01)
*H10K 59/35* (2023.01)
*H10K 59/80* (2023.01)
*H10K 71/60* (2023.01)

(52) U.S. Cl.
CPC ......... *H10K 59/353* (2023.02); *H10K 59/875* (2023.02); *H10K 71/60* (2023.02)

(58) Field of Classification Search
CPC .. H10K 59/8792; H10K 59/124; H10K 59/60; H10K 59/65; H10K 59/00–95; H10K 50/00–88; H10K 50/822
See application file for complete search history.

(56) References Cited

U.S. PATENT DOCUMENTS

| | | | | |
|---|---|---|---|---|
| 2021/0083023 | A1* | 3/2021 | Zheng | H10K 59/131 |
| 2022/0005906 | A1* | 1/2022 | Jeong | H10K 59/121 |
| 2022/0029125 | A1* | 1/2022 | Liu | H10K 59/121 |
| 2022/0045299 | A1* | 2/2022 | Liu | H10K 59/80524 |
| 2022/0123065 | A1* | 4/2022 | Jeong | H10K 59/352 |

FOREIGN PATENT DOCUMENTS

| | | | | |
|---|---|---|---|---|
| CN | 110783485 A | | 2/2020 | |
| CN | 111223886 A | * | 6/2020 | |
| CN | 111863892 A | | 10/2020 | |
| CN | 111863900 A | * | 10/2020 | ............. H10K 59/00 |
| CN | 112382651 A | | 2/2021 | |
| CN | 110783485 B | | 6/2021 | |
| CN | 213905360 U | | 8/2021 | |
| WO | 2020/192088 A1 | | 10/2020 | |
| WO | 2021/007975 A1 | | 1/2021 | |
| WO | 2021/057012 A1 | | 4/2021 | |

OTHER PUBLICATIONS

Gong English Translation (Year: 2020).*
International Search Report issued Dec. 29, 2021 in International Application No. PCT/CN2021/124659, 5 pages.
Written Opinion of the International Searching Authority issued Dec. 29, 2021 in International Application No. PCT/CN2021/124659, 2 pages.

* cited by examiner

DISPLAY PANEL AND PREPARATION METHOD THEREFOR, AND DISPLAY DEVICE

CROSS-REFERENCE

The present disclosure is a U.S. National Stage of International Application No. PCT/CN2021/124659, filed on Oct. 19, 2021, which claims priority to Chinese patent application No. 202011374922.0, entitled "DISPLAY PANEL AND PREPARATION METHOD THEREFOR, AND DISPLAY DEVICE", filed on Nov. 30, 2020, the entire content of which is incorporated herein by reference.

TECHNICAL FIELD

The present disclosure relates to a field of display technology, and more particularly, to a display panel and a preparation method for the display panel, and a display device including the display panel.

BACKGROUND

With development of a full screen technology, a screen-to-body ratio of mobile phone is required to be maximized. The higher screen-to-body ratio, the more stunning the visual perception will be. After a notch in screen, a water droplet screen, a hole-digging in screen has emerged, but these are not really full screens. For full screen technology, in order to achieve the "full screen" effect, a critical problem to be solved is the "hiding" of a front camera. Thus, an under-screen camera is an ultimate solution, and that is, the front camera is really "hidden", like in a screen fingerprint technology. A solution of the under-screen camera puts forward certain requirements for light transmittance of a display screen in the under-screen camera display region. A part of an OLED (Organic Light-emitting Diode) display panel that really transmits light is a gap between light-emitting diodes (sub-pixels).

At present, a mainstream approach is a "low pixel density solution", and that is the gap between the sub-pixels of the under-screen camera display region is increased by reducing a pixel density of the under-screen camera display region, thereby improving the light transmittance. However, a sparse pixel density of this region may lead to a display difference from a surrounding normal display region, and thus reducing the appearance. Thus, how to improve the light transmittance of the display panel of the under-screen camera display region on the premise of ensuring no display difference is a difficult problem.

It should be noted that the information disclosed in the above BACKGROUND section is only for enhancing the understanding of the background of the present disclosure, and thus may include information that does not constitute the prior art known to those of ordinary skill in the art.

SUMMARY

The present disclosure aims to overcome shortcomings of the prior art and provide a display panel, a preparation method for the display panel and a display device including the display panel.

According to an aspect of the present disclosure, a display panel is provided. The display panel is provided with a first region and a second region and includes:

a base substrate;
a light-emitting layer arranged on a side of the base substrate, wherein the light-emitting layer includes a plurality of light-emitting patterns, and orthographic projections of the plurality of light-emitting patterns on the base substrate do not overlap with each other;
a plurality of transparent suppression patterns arranged on the side of the base substrate and located between at least a part of adjacent light-emitting patterns, wherein the plurality of transparent suppression patterns are located in the first region and spaced apart from each other;
a first electrode arranged on a side of the light-emitting layer away from the base substrate, wherein a plurality of through holes are defined on the first electrode, orthographic projections of the through holes on the base substrate overlap with orthographic projections of the transparent suppression patterns on the base substrate.

In an exemplary embodiment of the present disclosure, a pixel density of the first region is the same as a pixel density of the second region.

In an exemplary embodiment of the present disclosure, the display panel further includes:

a planarization layer arranged on the side of the base substrate, and defined with a first via hole;
a pixel definition layer arranged on a side of the planarization layer away from the base substrate, and defined with a third via hole and a fourth via hole, wherein the third via hole is communicated with the first via hole;
wherein the transparent suppression patterns are arranged in the first via hole and the third via hole that are communicated, and the light-emitting patterns are arranged in the fourth via hole.

In an exemplary embodiment of the present disclosure, materials of the transparent suppression patterns are an inorganic material with high polarity or an organic material with high polarity, and a material of the first electrode is a conductive metal.

In an exemplary embodiment of the present disclosure, the display panel further includes:

a plurality of pixel units arranged in an array, wherein the pixel unit includes one first light-emitting pattern, one second light-emitting pattern and two third light-emitting patterns, and peripheral tangents of the pixel unit form a rectangle;
in a first direction, corners of two adjacent rectangles are opposite to each other, and a plurality of rectangles are arranged in a plurality of rows, and rectangles in adjacent two rows are arranged in a staggered manner; one transparent suppression pattern is arranged between at least two adjacent pixel units.

In an exemplary embodiment of the present disclosure, the transparent suppression pattern includes an intermediate region and four edge regions connected to the intermediate region, wherein the intermediate region is in a circular shape and the edge regions are in a strip shape.

In an exemplary embodiment of the present disclosure, in a first direction, first light-emitting patterns and second light-emitting patterns are alternately arranged to form a first row, and third light-emitting patterns are arranged to form a second row;

in a second direction, the first row and the second row are arranged alternately, and the first direction is perpendicular to the second direction;
two first light-emitting patterns and two second light-emitting patterns distributed in two adjacent rows and two adjacent columns form a virtual quadrangle, and the third light-emitting pattern is located in the virtual quadrangle;

the transparent suppression pattern is arranged between two adjacent third light-emitting patterns, and the transparent suppression pattern is arranged between the first light-emitting pattern and the second light-emitting pattern that are adjacent to each other.

In an exemplary embodiment of the present disclosure, the display panel further includes pixel units arranged in an array, wherein the pixel unit includes one first light-emitting pattern, one second light-emitting pattern and two third light-emitting patterns, the two third light-emitting patterns are arranged in a second direction, the one first light-emitting pattern and the one second light-emitting pattern are arranged in a first direction, the first light-emitting pattern and the second light-emitting pattern are located on a centerline of a line connecting center points of the two third light-emitting patterns;

in the first direction, a plurality of the pixel units are arranged in a row, the pixel units in two adjacent rows are arranged in a staggered manner, and the first direction is perpendicular to the second direction;

the transparent suppression patterns are arranged among first light-emitting patterns, second light-emitting patterns and two third light-emitting patterns that are adjacently arranged in two adjacent rows.

In an exemplary embodiment of the present disclosure, the transparent suppression pattern is in an elliptical shape.

In an exemplary embodiment of the present disclosure, the first light-emitting pattern is a red light-emitting pattern, the second light-emitting pattern is a blue light-emitting pattern, and the third light-emitting pattern is a green light-emitting pattern.

According to an aspect of the present disclosure, a display device is provided and includes the display panel according to any one of the above embodiments.

According to an aspect of the present disclosure, a preparation method for a display panel is provided and includes:

providing a base substrate, wherein the base substrate is provided with a first region and a second region;

forming a light-emitting layer on a side of the base substrate, wherein the light-emitting layer includes a plurality of light-emitting patterns, and orthographic projections of the plurality of light-emitting patterns on the base substrate do not overlap with each other;

forming a plurality of transparent suppression patterns on the side of the base substrate in the first region, wherein the plurality of transparent suppression patterns are located between at least a part of adjacent light-emitting patterns and spaced apart from each other;

forming a first electrode on a side of the light-emitting layer away from the base substrate, and defining a plurality of through holes on the first electrode, wherein orthographic projections of the through holes on the base substrate overlap with orthographic projections of the transparent suppression patterns on the base substrate.

In an exemplary embodiment of the present disclosure, the preparation method for the display panel further includes:

forming a planarization layer on the side of the base substrate, and defining a first via hole on the planarization layer;

forming a pixel definition layer on a side of the planarization layer away from the base substrate, and defining a third via hole and a fourth via hole on the pixel definition layer, wherein the third via hole is communicated with the first via hole;

wherein the light-emitting patterns are formed in the third via hole, and the transparent suppression patterns are formed in the first via hole and the third via hole that are communicated.

According to the display panel of the present disclosure and the preparation method for the display panel, a light-emitting layer is arranged on a side of the base substrate, the light-emitting layer includes a plurality of light-emitting patterns, and the orthographic projections of the plurality of light-emitting patterns on the base substrate do not overlap with each other. In the first region, the plurality of transparent suppression patterns are arranged on the side of the base substrate, the transparent suppression patterns are located between at least a part of adjacent light-emitting patterns, and the plurality of transparent suppression patterns are spaced apart from each other. The first electrode is arranged on a side of the light-emitting layer away from the base substrate, the plurality of through holes are defined on the first electrode, the orthographic projections of the through holes on the base substrate overlap with the orthographic projections of the transparent suppression patterns on the base substrate, and that is, there is no first electrode arranged on the transparent suppression pattern, so as to prevent the first electrode blocking the light and improve the light transmittance of the first region. Thus, a pixel density of the first region may be improved on the premise of ensuring the light transmittance, such that the pixel density of the first region is the same as that of the normal display region, without causing the display difference, thereby meeting the requirement of a higher resolution display. Moreover, the plurality of transparent suppression patterns are spaced apart each other such that the first electrode is still connected as a whole, without affecting a normal display of the first region.

It should be understood that the preceding general description and the following detailed description are exemplary and explanatory only and are not restrictive of the present disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings may also be obtained from these drawings without creative efforts.

Figure 1:
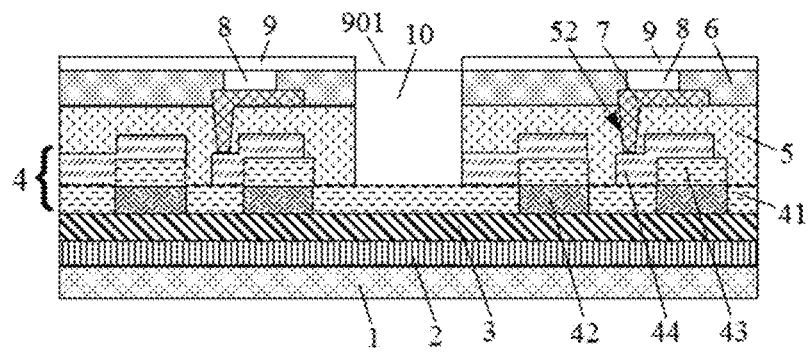
FIG. 1 is a structural diagram of an exemplary embodiment of a display panel of the present disclosure.

REFERENCE NUMERALS 1. base substrate; 2. organic film layer; 3. barrier layer;
4. array substrate; 41. insulation layer; 42. metal wiring; 43. interlayer dielectric layer; 44. source and drain electrodes;
5. planarization layer; 51. first via hole; 52. second via hole;
6. pixel definition layer; 61. third via hole; 62. fourth via hole;
7. anode (second electrode);
8. light-emitting pattern; 81. red light-emitting pattern; 82, blue light-emitting pattern; 83. green light-emitting pattern; 84. cover region of light-emitting material; 85. actual light-emitting region;
9. cathode (first electrode); 901. through hole;
10. transparent suppression pattern; 11. encapsulation layer; 12, fine metal mask; 13. opening;
141. under-screen camera display region; 142. normal display region.

DETAILED DESCRIPTION

Exemplary embodiments will now be described more fully with reference to the drawings. However, the exemplary embodiments may be embodied in multiple forms and should not be construed as limited to the examples set forth here; rather, these embodiments are provided such that present disclosure will be more thorough and complete, and will fully convey the concept of exemplary embodiments to those skilled in the art. Same reference numerals in the drawings represent the same or similar structures, and thus their detailed description will be omitted.

An exemplary embodiment provides a display panel. Referring, to structure diagrams of the exemplary embodiment of the display panel of the present disclosure shown in FIGS. 1, 9 and 12, the display panel is provided with a first region and a second region. The display panel may include a base substrate 1, a light-emitting layer, a transparent suppression pattern 10, and a first electrode 9. The light-emitting layer is arranged on a side of the base substrate 1, the light-emitting layer includes a plurality of light-emitting patterns, and orthogonal projections of the plurality of light-emitting patterns on the base substrate 1 do not overlap with each other. A plurality of transparent suppression patterns 10 are arranged on the side of the base substrate 1 and located between at least a part of adjacent light-emitting patterns, and the transparent suppression patterns 10 are located in the first region. The plurality of transparent suppression patterns 10 are spaced apart from each other. The first electrode 9 is arranged on a side of the light-emitting layer away from the base substrate 1, and a plurality of through holes 901 are defined on the first electrode 9. Orthographic projections of the through holes 901 on the base substrate 1 overlap with the orthographic projections of the transparent suppression patterns 10 on the base substrate 1.

The first region may be used for under-screen camera display, as well as fingerprint identification, infrared photography and other functions. The first region is an under-screen camera display region 141 for the under-screen camera display, and the second region is a normal display region 142.

The display panel and the preparation method for display panel of the present disclosure, in the under-screen camera display region 141, the plurality of transparent suppression patterns 10 are provided on the side of the base substrate 1 and located between at least a part adjacent light-emitting patterns, the plurality of transparent suppression patterns 10 are spaced apart from each other. The first electrode 9 is provided on a side of the light-emitting layer away from the base substrate 1, a plurality of through holes 901 are defined on the first electrode 9, the orthographic projections of the through holes 901 on the base substrate 1 overlap with the orthographic projections of the transparent suppression patterns 10 on the base substrate 1. That is, the first electrode 9 is not provided on the transparent suppression patterns 10, so as to prevent the first electrode 9 blocking light, and improve the light transmittance of the under-screen camera display region 141. Thus, a pixel density of the under-screen camera display region 141 may be increased on the premise of ensuring the light transmittance, such that the pixel density of the under-screen camera display region 141 is less than or equal to a pixel density of the normal display region 142, without causing the display difference, thereby meeting the requirement of a higher resolution display. Moreover, a plurality of transparent suppression patterns 10 are spaced apart each other such that the first electrode 9 is still connected as a whole, without affecting a normal display of the under-screen camera display region 141.

In the exemplary embodiment, the base substrate 1 may be a glass base substrate or, of course, a flexible base substrate. The base substrate 1 is provided with the under-screen camera display region 141 and the normal display region 142 surrounding the under-screen camera display region 141. In the under-screen camera display region 141, a camera may be arranged on a side of the base substrate 1.

An organic film layer 2 is arranged on an opposite side of the base substrate 1, and that is, the organic film layer 2 is arranged on an opposite side of the base substrate 1 where the camera is arranged. A material of the organic film layer 2 may be polyimide resin. A barrier layer 3 is arranged on a side of the organic film layer 2 away from the base substrate 1. The side of the barrier layer 3 away from the base substrate 1 is provided with an array substrate 4. The array substrate 4 may include a plurality of thin film transistors that are arranged in an array, and the thin film transistors serve as switch components to control the switching of each sub-pixel, i.e., to control whether each sub-pixel is displayed. The thin film transistor may include an insulation layer 41, a metal wiring 42, a gate, a gate insulation layer (not shown in the drawings due to a cutting position), an interlayer dielectric layer 43, and source and drain electrodes 44. The thin film transistor may be a top gate type, a bottom gate type, or a double gate type. Specific structures of thin film transistors are mature technologies, which will not be repeated herein.

Figure 9:
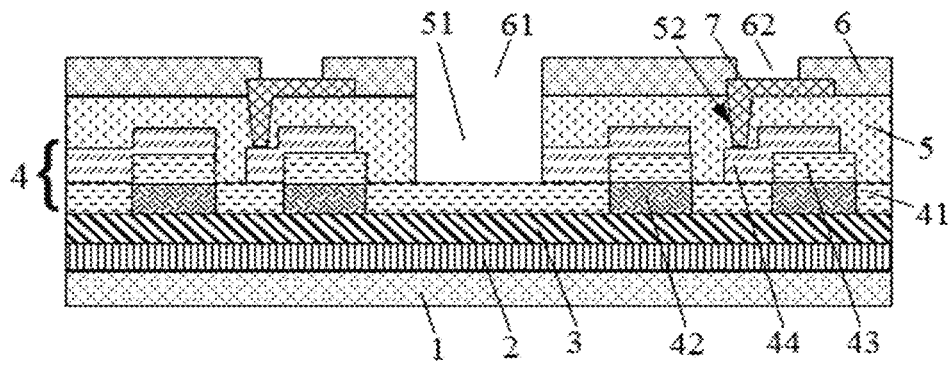
FIG. 9 is a structural diagram after a pixel definition layer is formed in a preparation method for a display panel of the present disclosure.

With reference to FIG. 9, in the exemplary embodiment, in the under-screen camera display region 141, a planarization layer 5 is arranged on the side of the array substrate 4 away from the base substrate 1, and a first via hole 51 and a second via hole 52 are defined on the planarization layer 5. A second electrode 7 is arranged on the side of a planarization layer 5 away from the base substrate 1. The second electrode 7 has a relatively small area and is only arranged in a pixel region. The second electrode 7 may be an anode 7, and the second electrode 7 is connected to the thin film transistor through the second via hole 52.

In the normal display region 142, a planarization layer 5 is arranged on the side of the array substrate 4 away from the base substrate 1, and a second via hole 52 is defined on the planarization layer 5. A second electrode 7 is arranged on a side of the planarization layer 5 away from the base substrate 1. The second electrode 7 may be an anode 7, and the second electrode 7 is connected to the thin film transistor through the second via hole 52.

As shown in FIG. 9, in the under-screen camera display region 141, a pixel definition layer 6 is arranged on sides of the planarization layer 5 and the second electrode 7 away from the base substrate 1, and a third via hole 61 and a fourth via hole 62 are defined on the pixel definition layer 6. The third via hole 61 is communicated with the first via hole 51, and that is, an orthographic projection of the third via hole 61 on the base substrate 1 overlaps with an orthographic projection of the first via hole 51 on the base substrate 1. The thin film transistors and various wirings are not arranged on positions of the third via hole 61 and the first via hole 51, and that is, an orthographic projection of the third via hole 61 on the base substrate 1 does not overlap with orthographic projections of the thin film transistors and various wirings on the base substrate 1, so as to prevent the thin film transistors and various wirings from affecting the light transmittance. The fourth via hole 62 is communicated with the second electrode 7 to expose the second electrode 7.

In the normal display region 142, a pixel definition layer 6 is arranged on sides of the planarization layer 5 and the second electrode 7 away from the base substrate 1, and a fourth via hole 62 is defined on the pixel definition layer 6. The fourth via hole 62 is communicated with the second electrode 7 to expose the second electrode 7. In the normal display region 142, it is unnecessary to consider a layout of thin film transistors and various wirings, since it is unnecessary to consider the light transmittance of the entire display panel in the normal display region 142.

As shown in FIG. 1, in the under-screen camera display region 141, the light-emitting patterns 8 are arranged on a side of the second electrode 7 away from the base substrate 1. The light-emitting patterns 8 is defined in the fourth via hole 62. An orthographic projection of each light-emitting pattern 8 on the base substrate 1 does not overlap with each other, and that is, the plurality of light-emitting patterns 8 are spaced apart from each other, or the adjacent two light-emitting patterns 8 are arranged in an edge-sharing manner or to be tangent to each other. One light-emitting pattern 8 forms one sub-pixel with a switch component controlling the light-emitting pattern 8. The plurality of light-emitting patterns 8 forms a light-emitting layer.

Further referring to FIG. 1, in the under-screen camera display region 141, transparent suppression patterns 10 are arranged in the third via hole 61 and the first via hole 51, and the plurality of transparent suppression patterns 10 are spaced apart from each other. Materials of the transparent suppression patterns 10 are an inorganic material with high polarity or an organic material with high polarity, such as Liq (8-hydroxyquinoline lithium), Alq3 (8-hydroxyquinoline aluminum), LiF (lithium fluoride), which has a strong repellent effect on the metal magnesium. Thus, the first electrode 9 cannot be generated on the transparent suppression pattern 10 subsequently.

In the normal display region 142, the transparent suppression patterns 10 are not arranged.

Arrangement for the sub-pixels is described in detail below.

In a following exemplary embodiment, a first light-emitting pattern is a red light-emitting pattern 81, a second light-emitting pattern is a blue light-emitting pattern 82, and a third light-emitting pattern is a green light-emitting pattern 83. The light-emitting pattern is a cover region 84 of the light-emitting material, and an area of an actual light-emitting region 85 is smaller than that of the cover region 84 of the light-emitting material. In the following exemplary embodiment, the light-emitting pattern is arranged to be in a circular shape. The blue light-emitting pattern 82 emitting blue light has the shortest lifetime among the red light-emitting pattern 81, the blue light-emitting pattern 82 and the green light-emitting pattern 83. Thus, the blue light-emitting pattern 82 has a larger light-emitting region than the red light-emitting pattern 81 and the green light-emitting pattern 83, thus preventing the reduction of a lifetime of the OLED display. That is, an optimized arrangement for a pixel structure of the OLED display may provide a longer lifetime. The light-emitting patterns may also be arranged to be in various shapes such as in an elliptical shape, in a rectangular shape, in a polygonal shape and the like.

Figure 2:
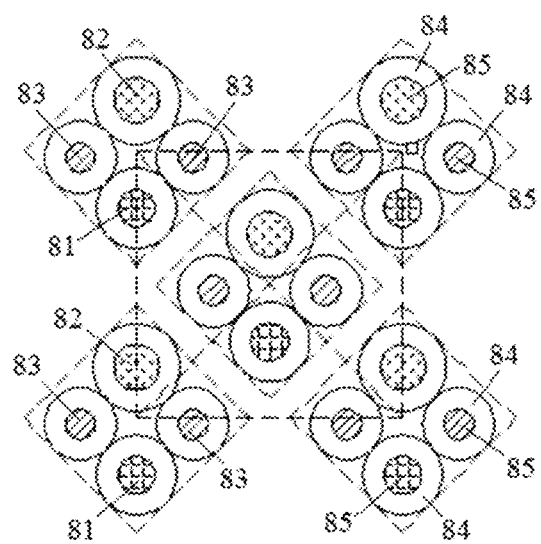
FIG. 2 is a structural diagram of an exemplary embodiment of a pixel arrangement of the display panel in FIG. 1.
Figure 3:
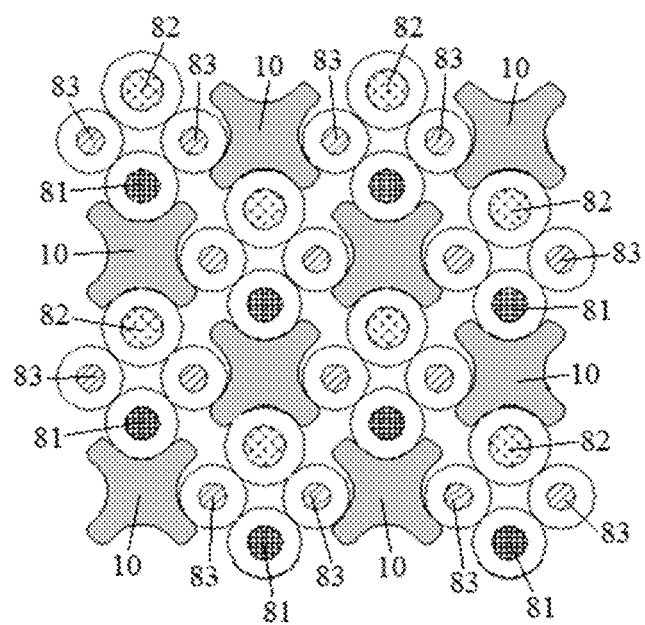
FIG. 3 is a structural diagram after a transparent suppression pattern is formed in FIG. 2.

Referring to FIGS. 2 and 3, in the exemplary embodiment, the display panel includes pixel units arranged in an array, and the pixel unit includes one red light-emitting pattern 81, one blue light-emitting pattern 82, and two green light-emitting patterns 83, which are four light-emitting patterns in total. The four light-emitting patterns may be arranged in a circle, and two adjacent light-emitting patterns of the four light-emitting patterns are arranged to be externally tangent to each other. Peripheral tangents of the pixel unit form a rectangle, such that the four light-emitting patterns are located at four corners of the rectangle, respectively. The two green light-emitting patterns 83 are opposite to each other, that is, the two green light-emitting patterns 83 are arranged at opposite two corners of the rectangle, and the one red light-emitting pattern 81 and the one blue light-emitting pattern 82 are opposite to each other. Since the blue light-emitting pattern 82 has the largest area, and the red light-emitting pattern 81 has a second largest area, while the red light-emitting pattern 81 and the blue light-emitting pattern 82 are opposite to each other, the peripheral tangents of the pixel unit are two tangents of the red light-emitting pattern 81 and two tangents of the blue light-emitting pattern 82, and the four tangents intersect to form the rectangle. In a first direction, corners of two adjacent rectangles are opposite to each other, and that is, diagonal lines of the two adjacent rectangles are on a straight line. A plurality of rectangles are arrayed to form a plurality of rows according to the above rule, adjacent two rows are arranged in a staggered manner, and that is, a rectangle in one of the two adjacent two rows is located within an included angle between the two adjacent rectangles in the other row.

Virtual centers of the rectangles of five pixel units are arranged at four corners and a center of a virtual large rectangle. The virtual large rectangle is in a square shape, and a side length of the virtual large rectangle is a size of a pixel pitch.

In the exemplary embodiment, in order to prevent disunity in design and disunities in each auxiliary fixture and in process flow of the preparation process, a pixel layout rule of the under-screen camera display region 141 is the same as that of the normal display region 142. Thus, the pixel layout rule of the normal display region 142 will not be repeated herein. Of course, in other exemplary embodiments of the present disclosure, the pixel layout rule of the under-screen camera display region 141 and the normal display region 142 may also be different, as long as the pixel densities are the same.

Further referring to FIG. 2 and FIG. 3, in the under-screen camera display region 141, one transparent suppression pattern 10 is arranged between at least two adjacent pixel units. Since space in the pixel unit is relatively small to accommodate the transparent suppression pattern 10, the transparent suppression pattern 10 is arranged between the at least two adjacent pixel units.

Specifically, the transparent suppression pattern 10 may include an intermediate region and four edge regions connected to the intermediate region. The intermediate region may be in a circular shape, and the edge regions may be in a strip shape with rounded chamfers arranged at connections between the intermediate region and the edge region, such that the intermediate region and the edge regions have smoothly transition. A rounded chamfer is also arranged at an end of the strip away from the intermediate region. The intermediate region is located between four adjacent pixel units, and one edge region is located between two adjacent pixel units. Of course, at an edge, the transparent suppression pattern 10 may be arranged between two or three adjacent pixel units, and the intermediate region may also be in a square shape, in a polygonal shape, and the like, and the edge regions may be in a an elliptical shape, in a rectangular shape, and the like.

In the exemplary embodiment shown in FIGS. 2 and 3, the light transmittance of the under-screen camera display region 141 may reach 38%.

Figure 4:
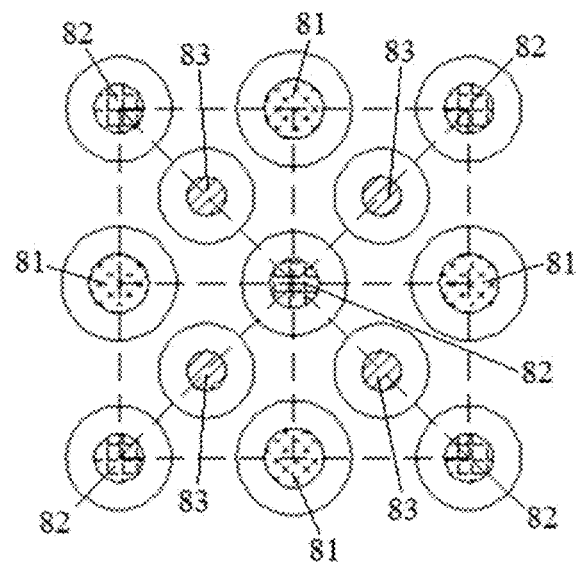
FIG. 4 is a structural diagram of another exemplary embodiment of a pixel arrangement of the display panel in FIG. 1.
Figure 5:
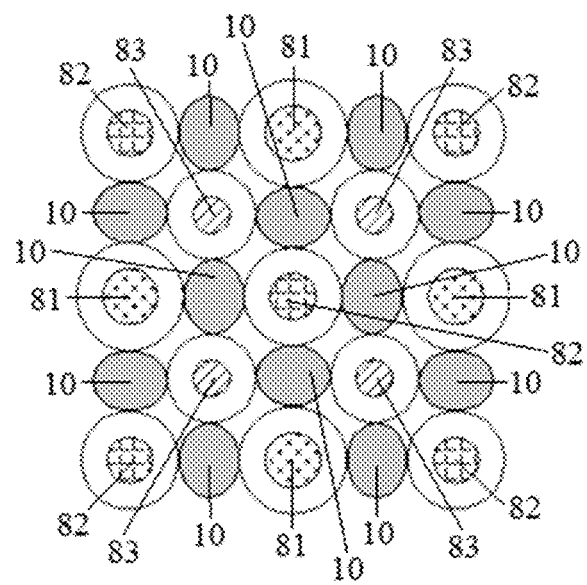
FIG. 5 is a structural diagram after a transparent suppression pattern is formed in FIG. 4.

Referring to FIGS. 4 and 5, in the exemplary embodiment, in a first direction, the first light-emitting pattern and the second light-emitting pattern are alternately arranged to form a first row, and the third light-emitting patterns are arranged to form a second row. In a second direction, the first row and the second row are arranged alternately. That is, a plurality of red light-emitting patterns 81 and a plurality of blue light-emitting patterns 82 are alternately arranged in the first direction to form a plurality of first rows, that is, one blue light-emitting pattern 82 is arranged between two adjacent red light-emitting patterns 81, one red light-emitting pattern 81 is arranged between two adjacent blue light-emitting patterns 82, and a first gap is defined between the red light-emitting patterns 81 and the blue light-emitting patterns 82 that are arranged. A plurality of green light-emitting patterns 83 are spaced apart from each other in the first direction to form a plurality of second rows, and that is, a second gap is defined between two adjacent green light-emitting patterns 83. The second row is between two adjacent first rows.

Two first light-emitting patterns and two second light-emitting patterns distributed in two adjacent rows and two adjacent columns form a virtual quadrangle, and the third light-emitting pattern is located in the virtual quadrangle. Specifically, the red light-emitting patterns 81 and the blue light-emitting patterns 82 in two adjacent first rows form a virtual quadrangle, and the green light-emitting pattern 83 is arranged at a center of the virtual quadrangle. A centerline of the green light-emitting pattern 83 is collinear with a centerline of a line connecting the blue light-emitting pattern 82 and the green light-emitting pattern 83, such that the plurality of red light-emitting patterns 81 and the plurality of blue light-emitting patterns 82 are still alternately arranged in the second direction to form a plurality of first columns, and a plurality of green light-emitting patterns 83 are still spaced apart from each other in the second direction to form a plurality of second columns. The second column is located between two adjacent first columns. The second direction is substantially perpendicular to the first direction.

It should be noted that the "perpendicular" mentioned in the exemplary embodiment of the present disclosure is not perfectly perpendicular, but with a certain error. The error range may be ±5 degrees, which means, two perpendicular to each other means that an included angle between the two is greater than or equal to 85 degrees and less than or equal to 95 degrees.

The five light-emitting patterns are located at four corners and a center of a virtual small square. The four virtual small squares form a virtual large square. A side length of the virtual large square is a size of two pixel pitches. Each virtual large square includes eight complete light-emitting patterns.

In the exemplary embodiment, in order to prevent disunity in design and disunities in each auxiliary fixture and in process flow of the preparation process, a pixel layout rule of the under-screen camera display region 141 is the same as that of the normal display region 142. Thus, the pixel layout rule of the normal display region 142 will not be repeated herein. Of course, in other exemplary embodiments of the present disclosure, the pixel layout rule of the under-screen camera display region 141 and the normal display region 142 may also be different, as long as the pixel densities are the same.

Referring to FIGS. 4 and 5, in the under-screen camera display region 141, one transparent suppression pattern 10 is arranged between the red light-emitting pattern 81 and the blue light-emitting pattern 82 that are adjacent, that is, the transparent suppression pattern 10 is arranged in the first gap, and the transparent suppression pattern 10 is a first transparent suppression pattern. One transparent suppression pattern 10 is arranged between two adjacent green light-emitting patterns 83, that is, the transparent suppression pattern 10 is arranged in the second gap, and the transparent suppression pattern 10 is a second transparent suppression pattern. The transparent suppression patterns 10 arranged in the two positions may be both in an elliptical shape, with a major axis of the first transparent suppression pattern along the second direction and a major axis of the second transparent suppression pattern along the first direction. In addition, structure of the transparent suppression pattern 10 is not limited to the above description. For example, the transparent suppression pattern 10 may also be arranged in a variety of shapes, such as in a polygonal shape, in a circular shape, in a rectangular shape, a waist-circular shape and the like.

In the exemplary embodiment shown in FIGS. 4 and 5, the light transmittance of the under-screen camera display region 141 may reach 38.9%.

Figure 6:
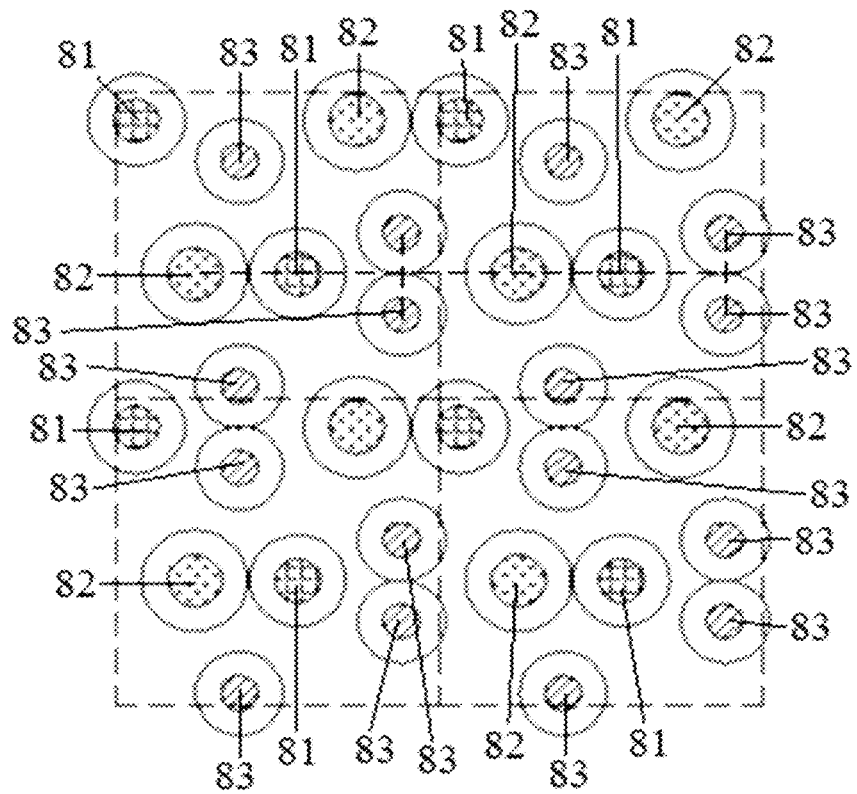
FIG. 6 is a structural diagram of yet another exemplary embodiment of a pixel arrangement of the display panel in FIG. 1.
Figure 7:
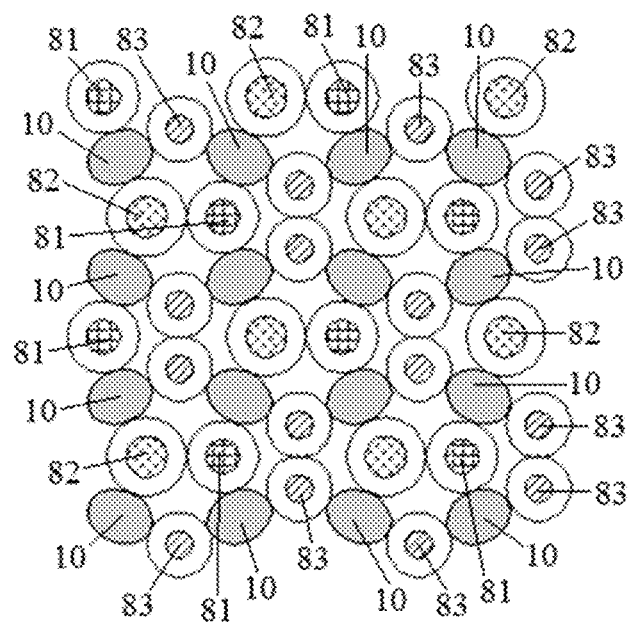
FIG. 7 is a structural diagram after a transparent suppression pattern is formed in FIG. 6.

With reference to FIGS. 6 and 7, in the exemplary embodiment, the display panel includes pixel units arranged in an array, and the pixel unit include one red light-emitting pattern 81, one blue light-emitting pattern 82, and two green light-emitting patterns 83. The two green light-emitting patterns 83 are arranged in the second direction, and the two green light-emitting patterns 83 are tangent to each other. The one red light-emitting pattern 81 and the one blue light-emitting pattern 82 are arranged in the first direction, and the red light-emitting pattern 81 is tangent to the blue light-emitting pattern 82. The red light-emitting pattern 81 and the blue light-emitting pattern 82 are located on a centerline of a line connecting center points of the two green light-emitting patterns 83, and that is, the centerline of the red light-emitting pattern 81 and the blue light-emitting pattern 82 is collinear with the centerline of the line connecting center points of the two green light-emitting patterns 83, such that the one red light-emitting pattern 81, the one blue light-emitting pattern 82 and the two green light-emitting patterns 83 form a "T" shape. The red light-emitting pattern 81 is closer to the green light-emitting pattern 83 than the blue light-emitting pattern 82, and a gap may be defined between the red light-emitting pattern 81 and the green light-emitting pattern 83. The second direction is substantially perpendicular to the first direction.

A plurality of pixel units are arranged in the first direction to form a row, and a plurality of rows are arranged in the second direction, and the pixel units in two adjacent rows are arranged in a staggered manner, such that a centerline of two green light-emitting patterns 83 in a row are substantially collinear with a centerline of a line connecting center points of the red light-emitting pattern 81 and the blue light-emitting pattern 82 in another row that is adjacent to the row It should be noted that the arrangement of pixel units is not limited to the above description. For example, the blue light-emitting pattern 82 may be closer to the green light-emitting pattern 83 than the red light-emitting pattern 81, and a gap is defined between the blue light-emitting pattern 82 and the green light-emitting pattern 83. It may also be that there is no gap defined between the blue light-emitting pattern 82 and the green light-emitting pattern 83, or there is no gap defined between the red light-emitting pattern 81 and the green light-emitting pattern 83.

A side length of a small virtual square is a size of four pixel pitches. Each virtual small square includes eight complete light-emitting patterns. Four small virtual squares form a large virtual square.

In the exemplary embodiment, in order to prevent disunity in design and disunities in each auxiliary fixture and in process flow of the preparation process, a pixel layout rule of the under-screen camera display region 141 is the same as that of the normal display region 142. Thus, the pixel layout rule of the normal display region 142 will not be repeated herein. Of course, in other exemplary embodiments of the present disclosure, the pixel layout rule of the under-screen camera display region 141 and the normal display region 142 may also be different, as long as the pixel densities are the same.

Further referring to FIG. 6 and FIG. 7, in the under-screen camera display region 141, the transparent suppression pattern 10 is arranged among red light-emitting patterns 81, blue light-emitting patterns 82 and two green light-emitting patterns 83 that are adjacently arranged in two adjacent rows. The transparent suppression pattern 10 may be in an elliptical shape, with two ends of a major axis of the transparent suppression pattern 10 to be tangent to the two green light-emitting patterns 83, and two ends of a minor axis of the transparent suppression pattern 10 to be tangent to the red light-emitting pattern 81 and the blue light-emitting pattern 82. In addition, structure of the transparent suppression pattern 10 is not limited to the above description. For example, the transparent suppression pattern 10 may also be arranged in a variety of shapes, such as in a polygonal shape, in a circular shape, in a rectangular shape, a waist-circular shape and the like.

In the exemplary embodiment shown in FIGS. 6 and 7, the light transmittance of the wider-screen camera display region 141 may reach 36%.

The arrangement of pixels has been described in detail in the above three exemplary embodiments. It may be understood by those skilled in the art that the arrangement of pixels is not limited to the above description. As long as the pixel density is ensured, an arrangement manner of the pixels of arranging a larger area of transparent suppression pattern 10 is feasible, and falls within a protection scope of the present disclosure.

Referring to FIG. 1, in the under-screen camera display region 141, a first electrode 9 is arranged on a side of the light-emitting layer away from the base substrate 1. The first electrode 9 may be a cathode 9, and a material of the first electrode 9 is conductive metal, specifically metal modified magnesium. A plurality of through holes 901 are defined on the first electrode 9. A number of through holes 901 is the same as that of the transparent suppression patterns 10. Orthographic projections of the through holes 901 on the base substrate 1 overlap with orthographic projections of the transparent suppression patterns 10 on the base substrate 1. That is, the through hole 901, rather than the first electrode 9, is formed on a side of the transparent suppression pattern 10 away from the base substrate 1, so as to increase the light transmittance of the under-screen camera display region 141.

The display panel may be a top emitting display panel or a bottom emitting display panel.

In addition, in other exemplary embodiments of the present disclosure, the transparent suppression pattern may be directly arranged on the pixel definition layer without setting the first via hole 51 on the planarization layer and without setting the third via hole 61 on the pixel definition layer. A fifth via hole may be defined on the insulating layer, the fifth via hole is communicated with the first via hole 51 and the third via hole 61, and the transparent suppression pattern is formed in the fifth via hole, the first via hole 51 and the third via hole 61. Alternatively, only the third via hole 61 is defined on the pixel definition layer, without setting the first via hole 51 on the planarization layer, and without setting the transparent suppression pattern in the third via hole 61.

Furthermore, the exemplary embodiment also provides a display device, which may include the display panel described in any of the above embodiments. The specific structure of the display panel has been described in detail above, and will not be repeated herein.

The specific type of the display device is not particularly limited, and the display device may be any type commonly used in the art, for example, a mobile device such as a mobile phone, a wearable device such as a watch, and a VR device, and the like. Those skilled in the art may select accordingly according, to the specific use of the display device, which will not be repeated here.

It should be noted that, the display device further includes other necessary components and structures besides the display panel. Taking the display as an example, specifically, for example, a housing, a circuit board, a power line and the like, are further included therein, and other components or structures may be added by those skilled in the art according to the specific usage requirements for the display device, and details thereof are not repeated herein.

Compared to the prior art, beneficial effects of the display device provided by the exemplary embodiment of the present disclosure are the same as those of the display panel provided by the exemplary embodiment above, and will not be repeated here.

Figure 8:
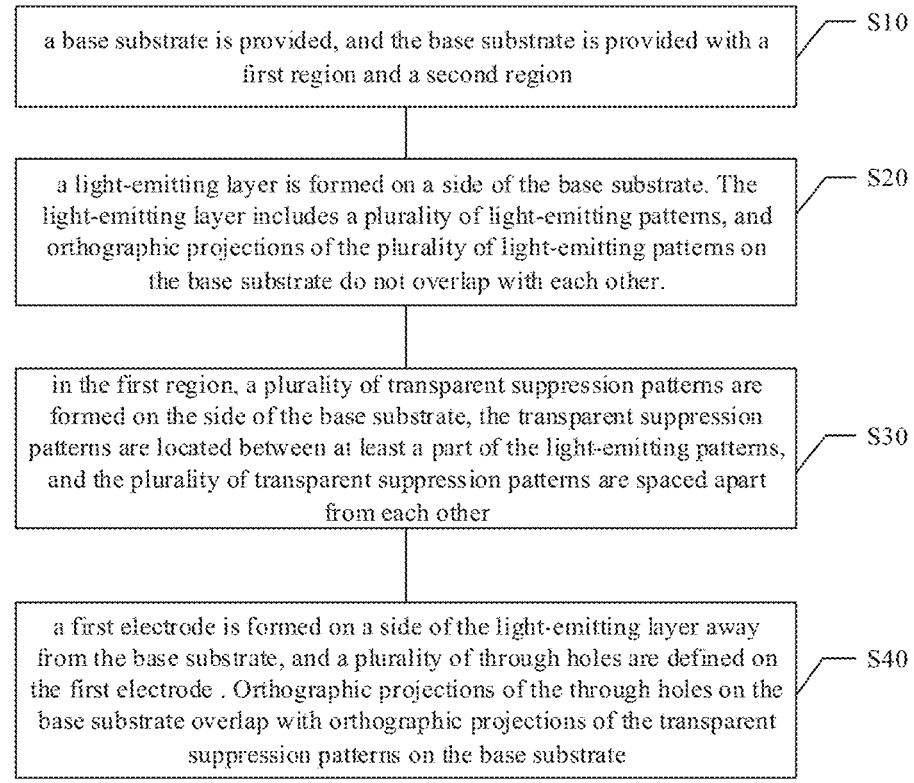
FIG. 8 is a flowchart of an exemplary embodiment of a preparation method for a display panel of the present disclosure.

Further, the exemplary embodiment also provides a preparation method of a display panel. Referring to the flowchart of the preparation method for the display panel of the present disclosure shown in FIG. 8, the preparation method may include the following steps:

step S10, a base substrate 1 is provided, and the base substrate 1 is provided with a first region and a second region.

step S20, a light-emitting layer is formed on a side of the base substrate 1. The light-emitting layer includes a plurality of light-emitting patterns, and orthographic projections of the plurality of light-emitting patterns on the base substrate 1 do not overlap with each other.

step S30, in the first region, a plurality of transparent suppression patterns 10 are formed on the side of the base substrate 1, the transparent suppression patterns 10 are located between at least a part of the light-emitting patterns, and the plurality of transparent suppression patterns 10 are spaced apart from each other.

step S40, a first electrode 9 is formed on a side of the light-emitting layer away from the base substrate 1, and a plurality of through holes 901 are defined on the first electrode 9. Orthographic projections of the through holes 901 on the base substrate 1 overlap with orthographic projections of the transparent suppression patterns 10 on the base substrate 1.

The preparation method for the display panel is described in detail below.

Referring to FIG. 9, a base substrate 1 is provided, and the base substrate 1 is provided with an under-screen camera display region 141 and a normal display region 142 surrounding the under-screen camera display region 141.

An organic film layer 2 is formed on a side of the base substrate 1. The organic film layer 2 is a flexible film layer to serve as the base substrate of the array substrate (in a subsequent process, the base substrate 1 may be stripped to leave the organic film layer 2 as a flexible base substrate). A barrier layer 3 is formed on a side of the organic film layer 2 away from the base substrate 1. The barrier layer 3 is used to block influence of water vapor and impurity ions (such as excessive H+) in the organic film layer 2 on a subsequently formed semiconductor pattern (polysilicon active layer). A buffer layer (not shown) may also be formed on a side of the barrier layer 3 away from the base substrate 1. The buffer layer is used to further block the water vapor and impurity ions in the organic film layer 2, and add hydrogen ions to the subsequently formed semiconductor pattern.

An array substrate 4 is formed on a side of the barrier layer 3 away from the base substrate 1, and the preparation method for the array substrate 4 adopts the method in the prior art, and will not be described here.

A planarization layer 5 is formed on the side of the array substrate away from the base substrate 1 by evaporation, deposition, sputtering and other processes. The planarization layer 5 is etched to form the first via hole 51 and the second via hole 52. The first via hole 51 is only formed on the under-screen camera display region 141, and the second via hole 52 is on the entire display panel.

An anode material layer is formed on a side of the planarization layer 5 away from the base substrate 1 by evaporation, deposition, sputtering and other processes, and the anode material layer is etched to form an anode 7 (the second electrode 7).

The pixel definition layer 6 is formed on sides of the anode 7 and the planarization layer 5 away from the base substrate 1 through evaporation, deposition, sputtering and other processes, and the pixel definition layer 6 is etched to form a third via hole 61 and a fourth via hole 62, the third via hole 61 is communicated with the first via hole 51, and the fourth via hole 62 is communicated with the anode 7 (the second electrode 7).

Referring to FIG. 1, a plurality of light-emitting patterns 8 are formed by evaporating an organic light-emitting material through RGB fine metal masks.

Figure 10:
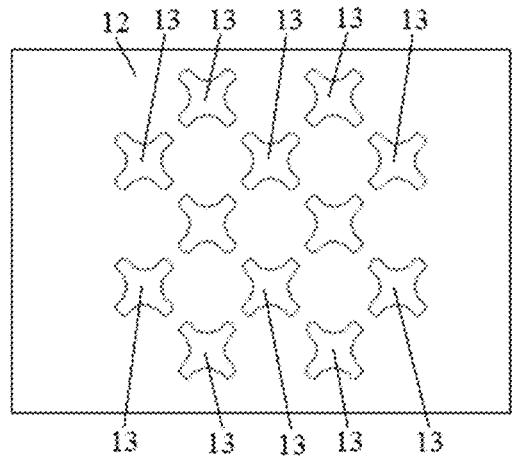
FIG. 10 is a structural diagram of a fine metal mask with an opening.

Then, the fine metal masks 12 with the openings 13 shown in FIG. 10 are used to evaporate a non-light-emitting region of the under-screen camera display region 141. A shape and position of the openings 13 are consistent with a shape and position of the transparent suppression pattern 10. The evaporated material is an inorganic material with high polarity or an organic material with high polarity, which has been described in detail above and will not be repeated here.

Figure 11:
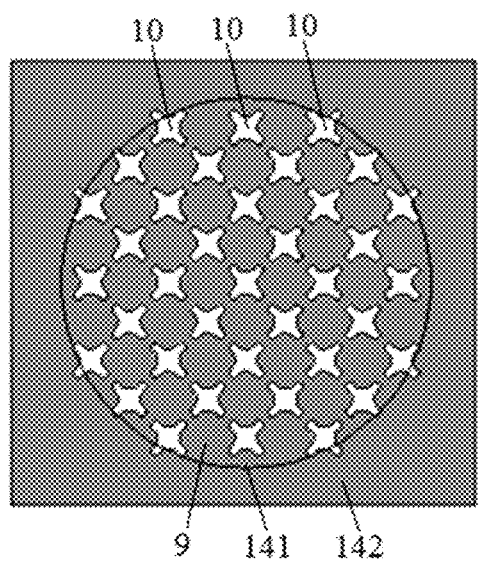
FIG. 11 is a schematic diagram showing an effect after evaporation of cathodes in an under-screen camera display region.

Finally, an open-type mask is used to evaporate a cathode material, the cathode material is metal modified magnesium. As shown in FIG. 11, since the inorganic material with high polarity or organic material with high polarity may effectively inhibit the film formation of metal modified magnesium, the metal magnesium where the transparent suppression pattern 10 is formed forms a through hole 901, rather than being filmed, which ensures the light transmission of the under-screen camera display region 141. The metal magnesium where the transparent suppression pattern 10 is not filmed may be completely filmed to form the cathode 9, which achieves the evaporation of the cathode 9 in the light-emitting region, and ensuring the normal operation of the display panel.

Figure 12:
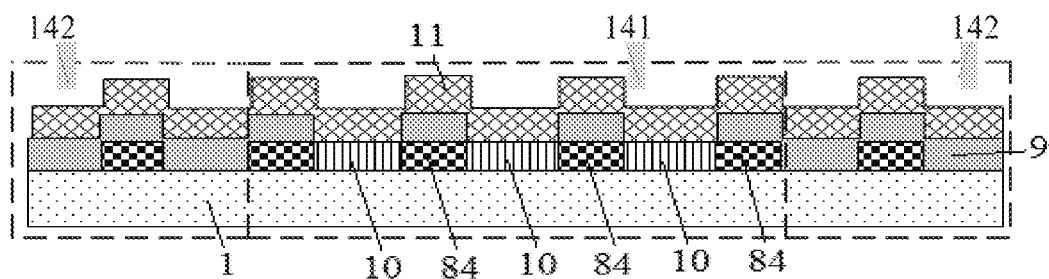
FIG. 12 is a structural diagram of another exemplary embodiment of a display panel of the present disclosure.

Referring to FIG. 12, an encapsulation layer 11 is formed on a side of the cathode 9 away from the base substrate 1. It may be seen from the drawing that no cathode 9 is formed on the transparent suppression pattern 10 of the under-screen camera display region 141, which improves the light transmittance of the under-screen camera display region 141.

The above-described features, structures or characteristics may be combined in one or more embodiments in any appropriate way. Wherever possible, features discussed in each embodiment are interchangeable. In the foregoing description, many specific details are provided for fully understanding embodiments of the present disclosure. However, it will be appreciated by those skilled in the art that technical solutions of the present disclosure may be practiced with one or more of the specific details being omitted, or, other methods, components, and materials may be used. Under other circumstances, well-known structures, materials, or operations will not be illustrated or described in detail, to prevent obscuration of various aspects of the present disclosure.

The terms "about" or "approximately" as used in this specification generally means 20%, preferably 10%, and more preferably 5% of a specified value or range. The number given herein is an approximate number, it means that the number may contain the meaning of "about", "approximately", "around" and "nearly" without particular descriptions.

Although relative terms such as "up" and "down" are used in this specification to describe the relative relationship between one component illustrated in the drawings and another component, these terms are used in this specification for convenience only, for example, according to the illustrative direction depicted in the drawings. It may be understood that if the device illustrated in the drawings is inversed and turned upside down, the component described "above" would become the component "below". Other relative terms, such as "high", "low", "top", "bottom" and the like, also have similar meanings. When a structure is "on" other structure(s), it may mean that the structure is integrally formed on the other structure(s), or that the structure is "directly" arranged on the other structure(s), or that the structure is "indirectly" arranged on other structure(s) through another structure.

Terms such as "one", "an/a", "the", and "said" are used in the specification to indicate the presence of one or more elements/component parts/and others. Terms "including", "including", and "having" have an inclusive meaning which means that there may be additional elements/component parts/and others in addition to the listed elements/component parts/and others. Terms "first", "second", and "third" are used herein only as markers, and they do not limit the number of objects modified after them.

It should be understood that the application of the present disclosure is not limit to the detailed structure and arrangement of components provided in this specification. The present disclosure may have other embodiments, and may be implemented and carried out in various ways. The aforementioned variations and modifications fall within the scope of the present disclosure. It should be understood that the disclosure disclosed and defined in this specification may extend to all alternative combinations of two or more individual features that are apparent or mentioned in the text and/or drawings. All of the different combinations form various alternative aspects of the present disclosure. Embodiments described in this specification illustrate the best modes known for carrying out the present disclosure, and will allow those skilled in the art to utilize the present disclosure.

What is claimed is:

1. A display panel provided with a first region and a second region, comprising:
   a base substrate;
   a light-emitting layer arranged on a side of the base substrate, wherein the light-emitting layer comprises a plurality of light-emitting patterns, and orthographic projections of the plurality of light-emitting patterns on the base substrate do not overlap with each other;
   a plurality of transparent suppression patterns arranged on the side of the base substrate and located between at least a part of adjacent light-emitting patterns, wherein the plurality of transparent suppression patterns are located in the first region and spaced apart from each other;
   a first electrode arranged on a side of the light-emitting layer away from the base substrate, wherein a plurality of through holes are defined on the first electrode, orthographic projections of the through holes on the base substrate overlap with orthographic projections of the transparent suppression patterns on the base substrate;
   a plurality of pixel units arranged in an array, wherein the pixel unit comprises one first light-emitting pattern, one second light-emitting pattern and two third light-emitting patterns, and peripheral tangents of the pixel unit form a rectangle; and
   in a first direction, corners of two adjacent rectangles are opposite to each other, and a plurality of rectangles are arranged in a plurality of rows, and rectangles in adjacent two rows are arranged in a staggered manner; one transparent suppression pattern is arranged between at least two adjacent pixel units;
   wherein the transparent suppression pattern comprises an intermediate region and four edge regions connected to the intermediate region, wherein the intermediate region is in a circular shape and the edge regions are in a strip shape.

2. The display panel according to claim 1, wherein a pixel density of the first region is the same as a pixel density of the second region.

3. The display panel according to claim 1, further comprising:
   a planarization layer arranged on the side of the base substrate, and defined with a first via hole;
   a pixel definition layer arranged on a side of the planarization layer away from the base substrate, and defined with a third via hole and a fourth via hole, wherein the third via hole is communicated with the first via hole;
   wherein the transparent suppression patterns are arranged in the first via hole and the third via hole that are communicated, and the light-emitting patterns are arranged in the fourth via hole.

4. The display panel according to claim 1, wherein materials of the transparent suppression patterns are an inorganic material with high polarity or an organic material with high polarity, and a material of the first electrode is a conductive metal.

5. The display panel according to claim 1, wherein the first light-emitting pattern is a red light-emitting pattern, the second light-emitting pattern is a blue light-emitting pattern, and the third light-emitting pattern is a green light-emitting pattern.

6. A display device, comprising a display panel provided with a first region and a second region, wherein the display panel comprises:
   a base substrate;
   a light-emitting layer arranged on a side of the base substrate, wherein the light-emitting layer comprises a plurality of light-emitting patterns, and orthographic projections of the plurality of light-emitting patterns on the base substrate do not overlap with each other;
   a plurality of transparent suppression patterns arranged on the side of the base substrate and located between at least a part of adjacent light-emitting patterns, wherein the plurality of transparent suppression patterns are located in the first region and spaced apart from each other;
   a first electrode arranged on a side of the light-emitting layer away from the base substrate, wherein a plurality of through holes are defined on the first electrode, orthographic projections of the through holes on the base substrate overlap with orthographic projections of the transparent suppression patterns on the base substrate;
   a plurality of pixel units arranged in an array, wherein the pixel unit comprises one first light-emitting pattern, one second light-emitting pattern and two third light-emitting patterns, and peripheral tangents of the pixel unit form a rectangle; and
   in a first direction, corners of two adjacent rectangles are opposite to each other, and a plurality of rectangles are arranged in a plurality of rows, and rectangles in adjacent two rows are arranged in a staggered manner; one transparent suppression pattern is arranged between at least two adjacent pixel units;
   wherein the transparent suppression pattern comprises an intermediate region and four edge regions connected to the intermediate region, wherein the intermediate region is in a circular shape and the edge regions are in a strip shape.

7. The display device according to claim 6, wherein a pixel density of the first region is the same as a pixel density of the second region.

8. The display device according to claim 6, further comprising:
a planarization layer arranged on the side of the base substrate, and defined with a first via hole;
a pixel definition layer arranged on a side of the planarization layer away from the base substrate, and defined with a third via hole and a fourth via hole, wherein the third via hole is communicated with the first via hole;
wherein the transparent suppression patterns are arranged in the first via hole and the third via hole that are communicated, and the light-emitting patterns are arranged in the fourth via hole.

9. The display device according to claim 6, wherein materials of the transparent suppression patterns are an inorganic material with high polarity or an organic material with high polarity, and a material of the first electrode is a conductive metal.

10. The display device according to claim 6, wherein in a first direction, first light-emitting patterns and second light-emitting patterns are alternately arranged to form a first row, and third light-emitting patterns are arranged to form a second row;
in a second direction, the first row and the second row are arranged alternately, and the first direction is perpendicular to the second direction;
two first light-emitting patterns and two second light-emitting patterns distributed in two adjacent rows and two adjacent columns form a virtual quadrangle, and one third light-emitting pattern is located in the virtual quadrangle;
one transparent suppression pattern is arranged between two adjacent third light-emitting patterns, and one transparent suppression pattern is arranged between the first light-emitting pattern and the second light-emitting pattern that are adjacent to each other.

11. The display device according to claim 6, further comprising pixel units arranged in an array, wherein the pixel unit comprises one first light-emitting pattern, one second light-emitting pattern and two third light-emitting patterns, the two third light-emitting patterns are arranged in a second direction, the one first light-emitting pattern and the one second light-emitting pattern are arranged in a first direction, the first light-emitting pattern and the second light-emitting pattern are located on a centerline of a line connecting center points of the two third light-emitting patterns;
in the first direction, a plurality of the pixel units are arranged in a row, the pixel units in two adjacent rows are arranged in a staggered manner, and the first direction is perpendicular to the second direction;
the transparent suppression patterns are arranged among first light-emitting patterns, second light-emitting patterns and two third light-emitting patterns that are adjacently arranged in two adjacent rows.

12. A preparation method for a display panel, comprising:
providing a base substrate, wherein the base substrate is provided with a first region and a second region;
forming a light-emitting layer on a side of the base substrate, wherein the light-emitting layer comprises a plurality of light-emitting patterns, and orthographic projections of the plurality of light-emitting patterns on the base substrate do not overlap with each other;
forming a plurality of transparent suppression patterns on the side of the base substrate in the first region, wherein the plurality of transparent suppression patterns are located between at least a part of adjacent light-emitting patterns and spaced apart from each other;
forming a first electrode on a side of the light-emitting layer away from the base substrate, and defining a plurality of through holes on the first electrode, wherein orthographic projections of the through holes on the base substrate overlap with orthographic projections of the transparent suppression patterns on the base substrate; and
forming a plurality of pixel units arranged in an array, wherein the pixel unit comprises one first light-emitting pattern, one second light-emitting pattern and two third light-emitting patterns, and peripheral tangents of the pixel unit form a rectangle;
wherein in a first direction, corners of two adjacent rectangles are opposite to each other, and a plurality of rectangles are arranged in a plurality of rows, and rectangles in adjacent two rows are arranged in a staggered manner; one transparent suppression pattern is arranged between at least two adjacent pixel units; and
wherein the transparent suppression pattern comprises an intermediate region and four edge regions connected to the intermediate region, wherein the intermediate region is in a circular shape and the edge regions are in a strip shape.

13. The preparation method for the display panel according to claim 12, further comprising:
forming a planarization layer on the side of the base substrate, and defining a first via hole on the planarization layer;
forming a pixel definition layer on a side of the planarization layer away from the base substrate, and defining a third via hole and a fourth via hole on the pixel definition layer, wherein the third via hole is communicated with the first via hole;
wherein the light-emitting patterns are formed in the third via hole, and the transparent suppression patterns are formed in the first via hole and the third via hole that are communicated.

* * * * *